United States Patent
Hsu et al.

(10) Patent No.: US 9,524,987 B2
(45) Date of Patent: Dec. 20, 2016

(54) FIN-SHAPED STRUCTURE AND METHOD THEREOF

(71) Applicant: UNITED MICROELECTRONICS CORP., Hsin-Chu (TW)

(72) Inventors: Chih-Kai Hsu, Tainan (TW); Yu-Hsiang Hung, Tainan (TW); Ssu-I Fu, Kaohsiung (TW); Jyh-Shyang Jenq, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/519,146

(22) Filed: Oct. 21, 2014

(65) Prior Publication Data

US 2016/0111448 A1    Apr. 21, 2016

(51) Int. Cl.
| | |
|---|---|
| *H01L 29/10* | (2006.01) |
| *H01L 27/12* | (2006.01) |
| *H01L 29/78* | (2006.01) |
| *H01L 29/66* | (2006.01) |
| *H01L 29/06* | (2006.01) |
| *H01L 21/762* | (2006.01) |
| *H01L 21/84* | (2006.01) |

(52) U.S. Cl.
CPC ....... *H01L 27/1211* (2013.01); *H01L 21/7624* (2013.01); *H01L 21/76202* (2013.01); *H01L 21/845* (2013.01); *H01L 29/0649* (2013.01); *H01L 29/0653* (2013.01); *H01L 29/66795* (2013.01); *H01L 29/785* (2013.01)

(58) Field of Classification Search
CPC ............ H01L 27/1211; H01L 21/02238; H01L 21/7624; H01L 21/845; H01L 29/66795
See application file for complete search history.

(56) References Cited

U.S. PATENT DOCUMENTS

| | | | | |
|---|---|---|---|---|
| 7,141,456 | B2 * | 11/2006 | Lee | H01L 29/7851 257/E21.158 |
| 7,320,908 | B2 * | 1/2008 | Son | H01L 21/823481 257/E21.429 |
| 7,470,570 | B2 | 12/2008 | Beintner | |
| 8,772,860 | B2 | 7/2014 | Huang | |
| 2012/0299099 | A1 * | 11/2012 | Huang | H01L 29/66795 257/347 |
| 2013/0161756 | A1 * | 6/2013 | Glass | H01L 29/66545 257/369 |

* cited by examiner

*Primary Examiner* — Jesse Y Miyoshi
*Assistant Examiner* — Tuan A Hoang
(74) *Attorney, Agent, or Firm* — Winston Hsu; Scott Margo

(57) ABSTRACT

A method of forming a fin-shaped structure includes the following steps. A substrate having at least a fin structure thereon is provided. A liner is formed on sidewalls of the fin structure. An oxide layer is formed between the fin structure and the substrate. The fin structure is removed until a bottom layer of the fin structure is reserved, to form a recess between the liner. A buffer epitaxial layer and an epitaxial layer are sequentially formed in the recess. A top part of the liner is removed until sidewalls of the epitaxial layer are exposed. Moreover, a fin-shaped structure formed by said method is also provided.

9 Claims, 7 Drawing Sheets

FIN-SHAPED STRUCTURE AND METHOD THEREOF

BACKGROUND OF THE INVENTION

1. Field of the Invention

The present invention relates generally to a fin-shaped structure and a method thereof, and more specifically to a fin-shaped structure including a bottom part having oxides and a top part having epitaxial structures, and a method thereof.

2. Description of the Prior Art

With increasing miniaturization of semiconductor devices, various multi-gate MOSFET devices have been developed. The multi-gate MOSFET is advantageous for the following reasons. Manufacturing processes of multi-gate MOSFET devices can be integrated into traditional logic device processes, and are therefore more compatible. In addition, since the three-dimensional structure of the multi-gate MOSFET increases the overlapping area between the gate and the substrate, the channel region is controlled more effectively. This therefore reduces drain-induced barrier lowering (DIBL) effects and short channel effects. Moreover, the channel region is longer for a similar gate length, so the current between the source and the drain is increased.

In the present semiconductor process, a localized oxidation isolation (LOCOS) or a shallow trench isolation (STI) is normally used to isolate each MOS. Due to the reduction in both design sizes and fabricating line widths of the semiconductor wafers, however, pits, crystal defects and longer bird's beaks in the LOCOS process will greatly affect the characteristics of the semiconductor wafer. In the same way, the field oxide produced in the LOCOS process occupies a larger volume, which affects the integration of the semiconductor wafer. Thus, in the submicron semiconductor processes, the STI process is widely used as an isolation technique to isolate each of the multi-gate MOSFET components, thanks to its smaller size and improved integration. The STI process works by forming shallow trench isolation structures between each fin-shaped structure to electrically isolate them from each other.

In modern multi-gate MOSFET processes, ion implantation processes and annealing processes may be performed below each fin-shaped structure and the substrate between each fin-shaped structure, to form channel stop layers with an opposite electrical type below them for electrically isolating transistors formed on each fin-shaped structure. Dopants imported during the ion implantation processes are insufficient, however, leading to circuit leakage caused by each of the fin-shaped structures being incompletely electrically isolated.

SUMMARY OF THE INVENTION

The present invention provides a fin-shaped structure and a method thereof, which forms an oxide layer sandwiched by heterojunction fin structures and a substrate and between each heterojunction fin structure, so that the fin-shaped structures can be completely electrically isolated. Performances such as electrical mobility can thereby be improved.

The present invention provides a method of forming a fin-shaped structure including the following step. A substrate having at least a fin structure thereon is provided. A liner is formed on sidewalls of the fin structure. An oxide layer is formed between the fin structure and the substrate. The fin structure is removed until a bottom layer of the fin structure is reserved, so a recess is formed between the liner. A buffer epitaxial layer and an epitaxial layer are sequentially formed in the recess. A top part of the liner is removed until sidewalls of the epitaxial layer are exposed.

The present invention provides a fin-shaped structure including at least a fin structure and an oxide layer. The fin structure is disposed on a substrate, wherein the fin structure includes a silicon layer, a buffer epitaxial layer and an epitaxial layer stacked from bottom to top. The oxide layer is disposed between the fin structure and the substrate.

According to the above, the present invention provides a fin-shaped structure and a method thereof, which forms a liner on sidewalls of a part of a fin-shaped structure, and then oxidizes a part of the fin-shaped structure not covered by the liner and a part of a substrate between each of the fin-shaped structures, so that the fin-shaped structures can be completely electrically isolated from each other and the substrate. Moreover, the part of the fin-shaped structure covered by the liner is partially replaced with other materials to form a heterojunction fin-shaped structure, which improves performances such as electrical mobility.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
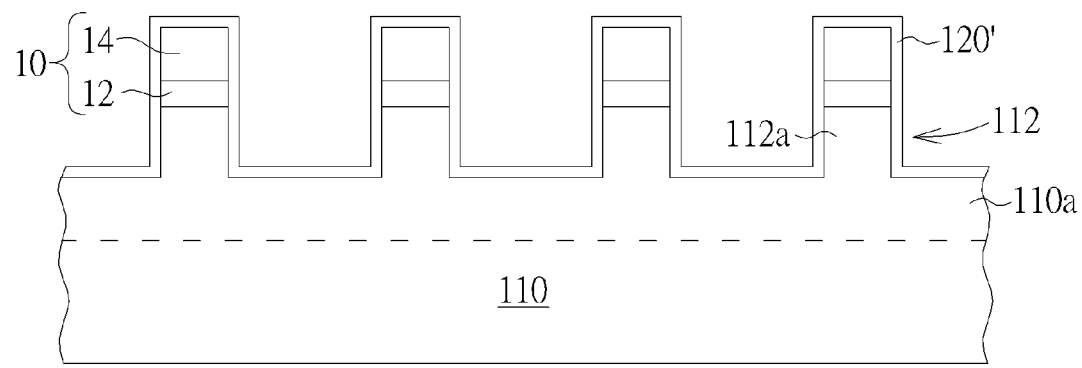
FIGS. 1-14 schematically depict cross-sectional views of a method of forming a fin-shaped structure according to an embodiment of the present invention.

FIGS. 1-14 schematically depict cross-sectional views of a method of forming a fin-shaped structure according to an embodiment of the present invention. As shown in FIG. 1, top parts 112a of fin structures 112 are formed on a substrate 110. In one case, the substrate 110 depicted in the figures is an area of a non-planar MOS transistor area while a planar MOS transistor area or a periphery circuit area forming other semiconductor components may be in other areas adjacent to this area, but are not depicted herein. The method of forming the top parts 112a of the fin structures 112 on the substrate 110 may include the following. A bulk substrate (not shown) is provided, and a hard mask layer 10 is patterned on the bulk substrate to define the locations of the top parts 112a of the fin-shaped structures 112 in the bulk substrate (not shown). The hard mask layer 10 may include a stacked structure of a pad oxide layer 12 and a pad nitride layer 14, but this is not limited thereto. An etching process is performed to form the top parts 112a of the fin-shaped structures 112 in the bulk substrate (not shown), which completes the top parts 112a of the fin-shaped structures 112 on the substrate 110. Four fin-shaped structures 112 are depicted in the figures, but the number of the fin-shaped structures 112 is not restricted thereto. In this embodiment, the substrate 110 and the fin-shaped structures 112 are composed of silicon. The top parts 112a of the fin-shaped structures 112 must contain silicon that will be partially replaced with epitaxial structures in later processes.

Figure 2:
Figure 2:
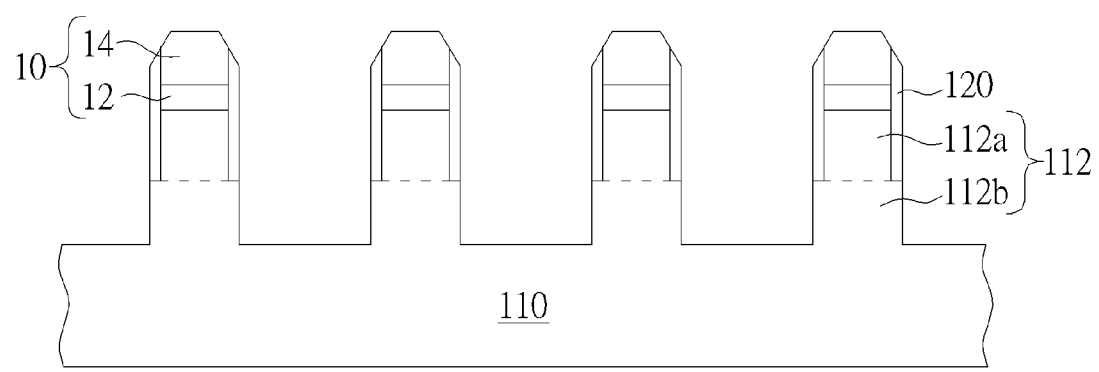

Then, a liner material 120' conformally covers the substrate 110, the top parts 112a of the fin-shaped structures 112 and the hard mask layer 10. An etching process P1 may be performed to etch the liner material 120' on the substrate 110 between the top parts 112a of the fin-shaped structures 112 and a top part 110a of the substrate 110, so a bottom part 112b of each of the fin structures 112 and a liner 120 on each of the fin structures 112 is formed, as shown in FIG. 2. The top part 112a and the bottom part 112b constitute each of the fin structures 112. Meanwhile, the liner 120 is formed on sidewalls of each top part 112a of the fin-shaped structures 112 while exposing a bottom part 112b of each of the fin-shaped structures 112.

In this embodiment, the liner material 120' is a nitride layer. In another embodiment, the liner material 120' may be an antioxidant single layer or an antioxidant multilayer to prevent the top parts 112a of the fin-shaped structures 112 covered by the liner material 120' from being oxidized during later oxidation processes. The antioxidant single layer or the antioxidant multilayer may be silicon oxynitride, amorphous carbide or silicon carbide.

In this embodiment, the etching process P1 is a dry etching process, which is a non-isotropic etching process, so that fin-shaped structures 112 having vertical sidewalls can be formed, but this is not limited thereto. In another embodiment, a dry etching process may be first performed and then a wet etching process is performed. In this embodiment, the liners 120 and the bottom part 112b of each fin-shaped structure 112 can be formed through performing the etching process P1 once. In another embodiment, a plurality of etching processes can be carried out. For example, the liner material 120' is etched first to form the liners 120 on the sidewalls of the top parts 112a, and the substrate 110 between each of the top parts 112a is then etched to form the bottom part 112b of each of the fin-shaped structures 112. In this embodiment, the materials of the liner material 120' and the pad nitride layer 14 are the same, but the thickness of the pad nitride layer 14 is larger than the thickness of the liner material 120'. This means the pad nitride layer 14 will not be consumed completely when the liner material 120' is removed, which would damage the fin-shaped structures 112 below the pad nitride layer 14. In another embodiment, the materials of the liner material 120' and the pad nitride layer 14 may be different, so they have different etching rates with respect to a specific etching gas/gas combination. By properly designing the thickness ratio, damages to the fin-shaped structures 112 can be avoided by reserving the pad nitride layer 14 after the liner material 120' is removed.

Figure 3:
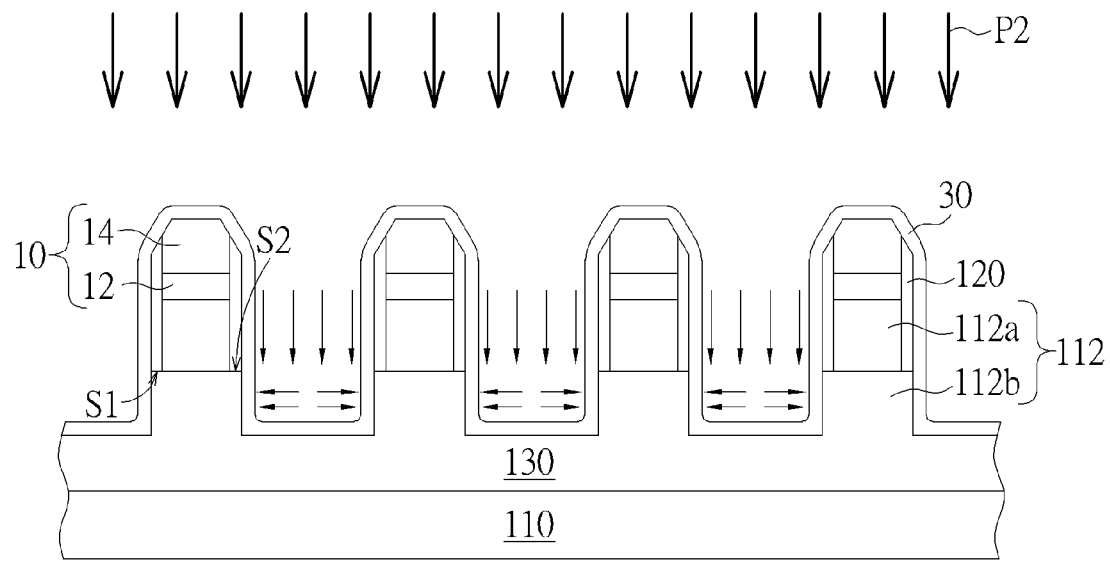

As shown in FIG. 3, an oxide liner 30 may be optionally formed beside the bottom parts 112b of the fin structures 112 to prevent the fin structures 112 from collapsing while performing a later oxidation process. In this embodiment, the oxide liner 30 conformally covers the whole fin structures 112 and the substrate 110 by methods such as a chemical oxide process, but this is not limited thereto. In another embodiment, the oxide liner 30 may be only formed beside the bottom parts 112b in other selective oxide processes.

An oxidation process P2 is then performed to oxidize the bottom part 112b of each of the fin-shaped structures 112 and the substrate 110 between each of the fin-shaped structures 112 exposed by the liners 120, so that an oxide layer 130 is formed in the bottom part 112b of each of the fin-shaped structures 112 and a part of the substrate 110 between each of the fin-shaped structures 112. In this embodiment, the oxide layer 130 is formed by performing the oxidation process P2, which is preferably an $O_2$ steam thermal process or a dry thermal oxidation process, but is not limited thereto. In another embodiment, other isolating processes such as a nitridation process may be performed to form a dielectric layer with other isolation materials such as a nitride layer.

The fin-shaped structures 112 or the top parts 112a of the fin-shaped structures 112 (as the bottom parts 112b of the fin-shaped structures 112 are oxidized to be part of the oxide layer 130) and the substrate 110 sandwich the oxide layer 130 top and bottom. Therefore, the top part 112a of each of the fin-shaped structures 112 is a silicon structure, and the bottom part 112b is an oxide structure, which is a part of the oxide layer 130. In other words, a part of the oxide layer 130 extends to the fin structures 112.

It is emphasized that, since the top parts 112a of fin-shaped structures 112 are located on the oxide layer 130, and the oxide layer 130 is located directly below the top part 112a of each of the fin-shaped structures 112, and on the substrate 110 between the top part 112a of each of the fin-shaped structures 112, each of the fin-shaped structures 112 can electrically isolate the substrate 110 in the present invention, and each of the fin-shaped structures 112 are also electrically isolated with respect to each other. Transistors formed on the fin-shaped structures 112 are therefore electrically isolated from each other and the substrate 110. Moreover, the oxide layer 130 can be located only in this depicted area to be used for electrically isolating components in this area, without affecting components in/on the substrate (not shown) surrounding the oxide layer 130 or in other adjacent areas.

More precisely, the liner 120 is located on the top part 112a of each of the fin-shaped structures 112, enabling the bottom part 112b of each of the fin-shaped structures 112 being oxidized to form a part of the oxide layer 130, so that transistors formed on the fin-shaped structures 112 can be electrically isolated from the substrate 110. Circuit leakage flowing downwards can therefore be avoided. As the fin-shaped structures 112 not covered by the liners 120 (such as the lower parts 112b in this embodiment) will be oxidized, a bottom surface S1 of the liner 120 trims with a top surface S2 of the oxide layer 130, but this is not limited thereto.

Figure 4:
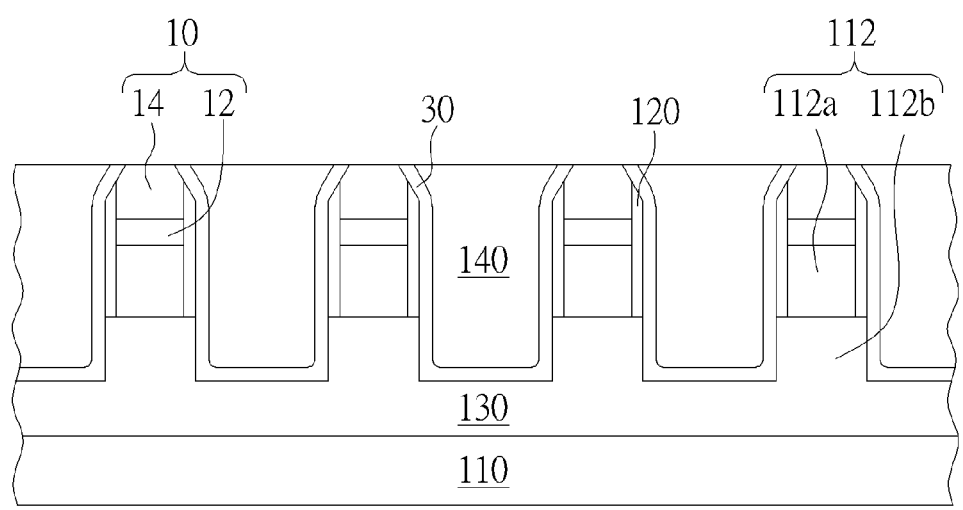

As shown in FIG. 4, an isolation structure 140 is formed on the oxide layer 130 between the fin-shaped structures 112. In this embodiment, the isolation structure 140 is a shallow trench isolation (STI) structure, which may be formed through a shallow trench isolation (STI) process. An isolation material (not shown) may be formed on the substrate 110 and entirely covers each of the fin-shaped structures 112 and the oxide layer 130. The isolation material (not shown) is planarized to trim with the hard mask layer 10.

Figure 5:
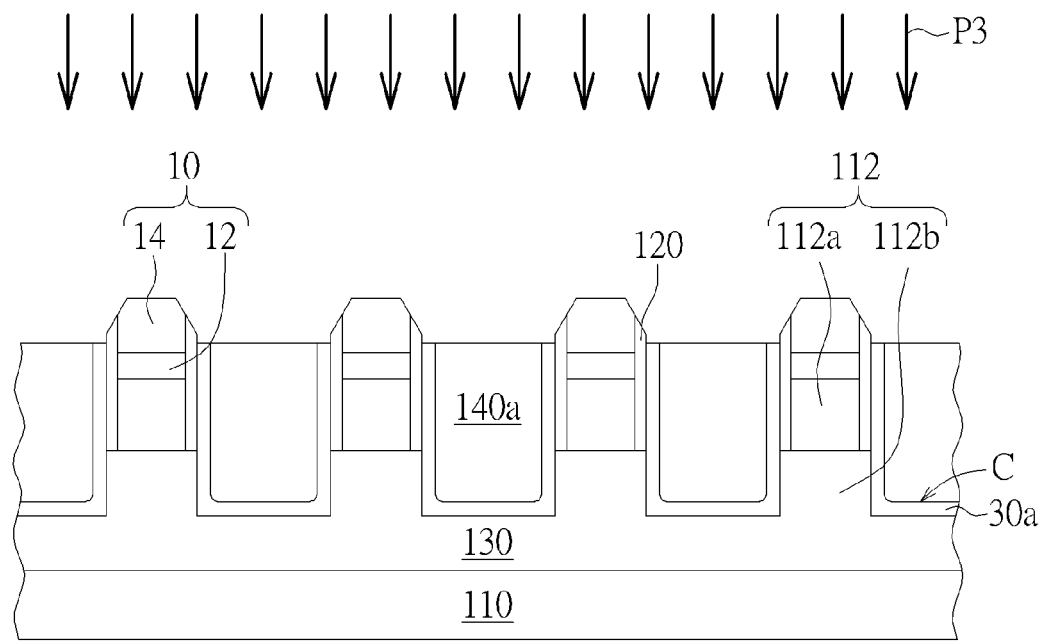

As shown in FIG. 5, an etching back process P3 may be performed to etch back the isolation structure 140 to expose at least a part of the hard mask layer 10 to be removed later, so the isolation structure 140a is formed. The etching back process P3 may be a dry etching process or a wet etching process depending upon practical requirements. It is noted that, although the oxide layer 130 or the oxide liner 30 of this embodiment is an oxide layer and the isolation structure 140a is a shallow trench isolation (STI) structure, which means that the isolation structure 140a is also an oxide layer, there is still an interface C because of their different forming methods. As the isolation structure 140 is etched back, the oxide liner 30 is also etched back and forms the oxide liner 130a which trims the isolation structure 140a.

Figure 6:
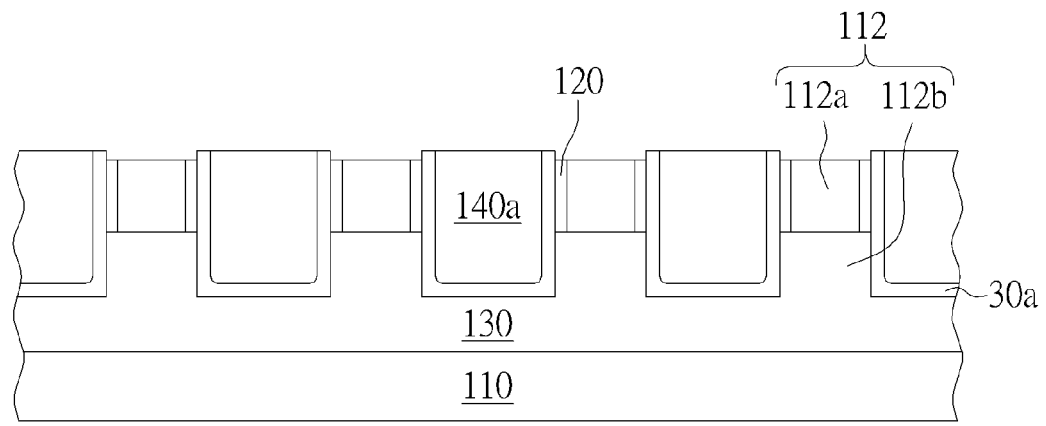
Figure 7:
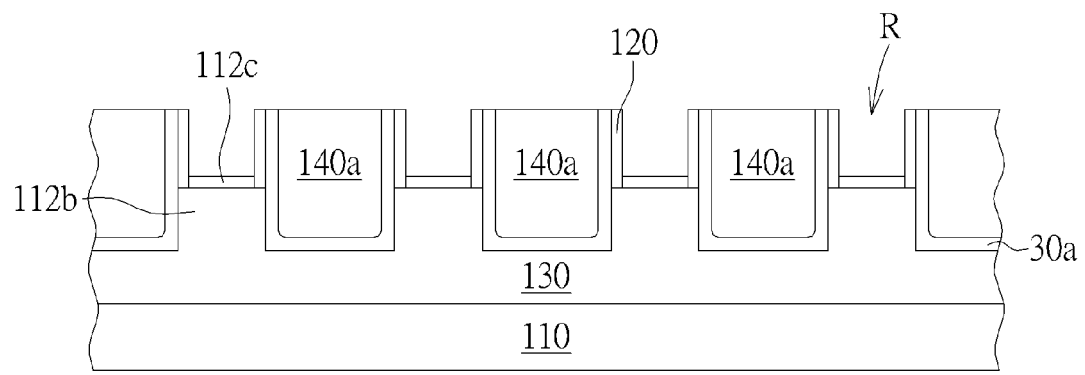

The hard mask 10 is removed to expose the top parts 112a of the fin structures 112, as shown in FIG. 6. Then, the top parts 112a of the fin structures 112 are removed until bottom layers 112c of the top parts 112a of the fin structures 112 are reserved, as shown in FIG. 7. Recesses R are formed between the liners 120 and the bottom layers 112c directly contacting the oxide layer 130.

Figure 8:
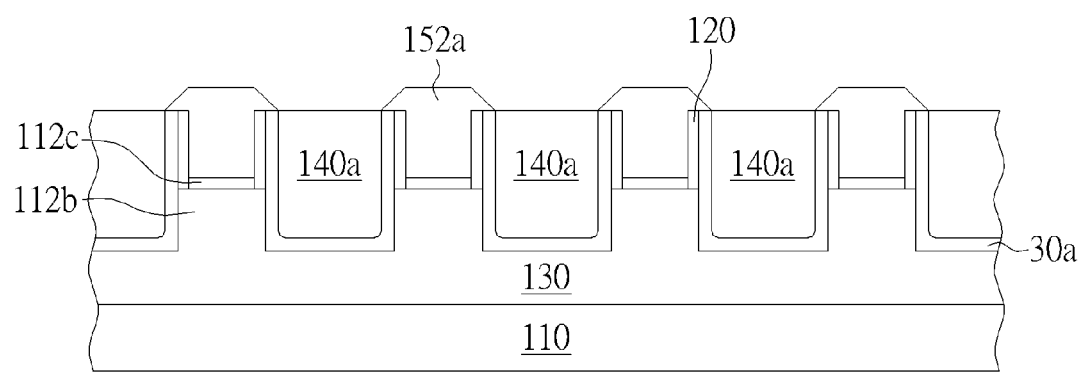
Figure 9:
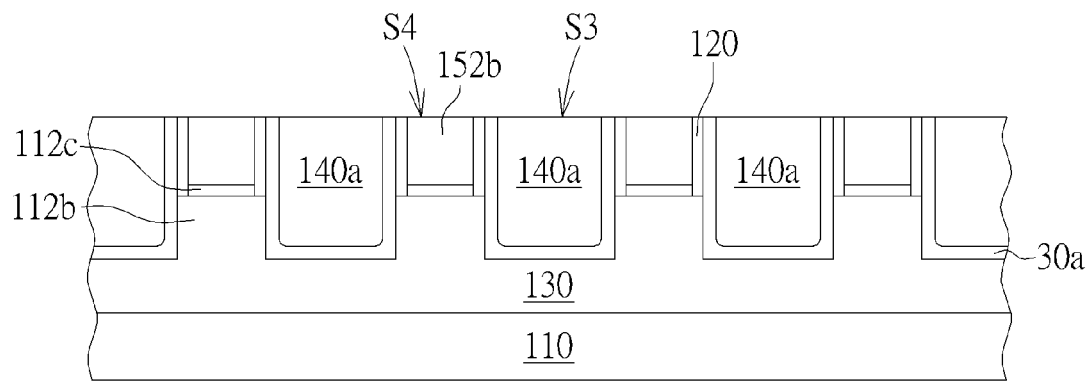
Figure 10:
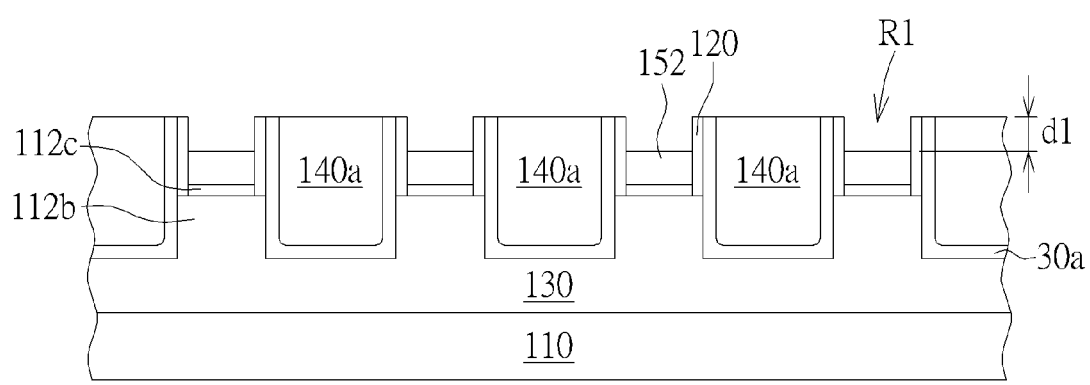
Figure 11:
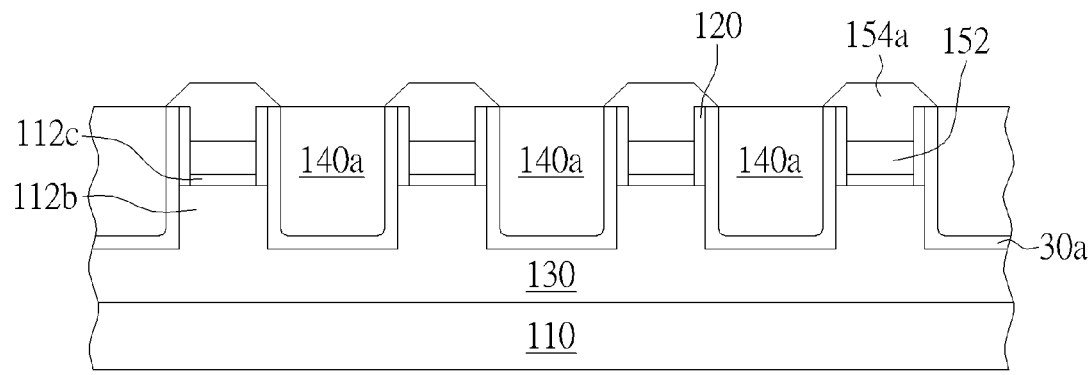
Figure 12:
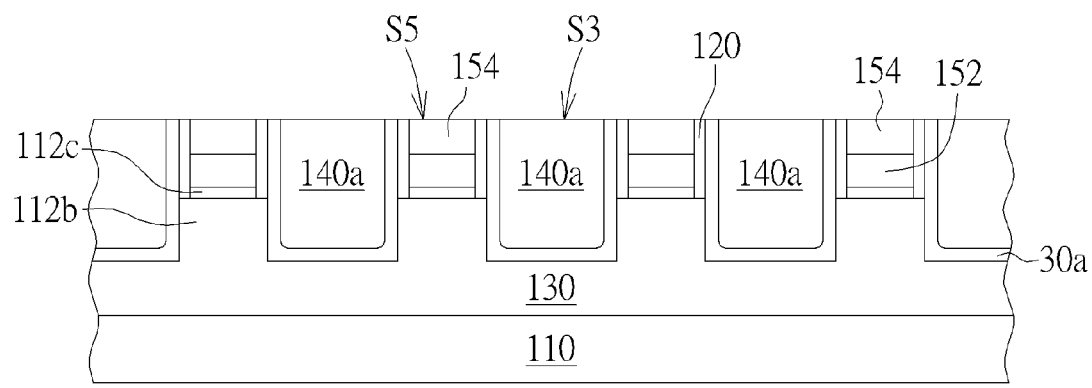

As shown in FIGS. 8-12, buffer epitaxial layers 152 and epitaxial layers 154 are sequentially formed in the recesses R. It is emphasized that, due to the bottom layers 112c of the top parts 112a of the fin structures 112 being reserved, and the bottom layers 112c containing silicon, the buffer epitaxial layers 152 and the epitaxial layers 154 can be formed or grow on the bottom layers by epitaxy. Preferably, the bottom layers 112c are silicon layers for the buffer epitaxial layers 152 and the epitaxial layers growing thereon. More precisely, as shown in FIG. 8, a buffer epitaxial layer 152a is formed or grown on each of the bottom layers 112c and fills each of the recesses R by epitaxy. Then, the buffer epitaxial layer 152a is planarized by methods such as a chemical mechanical polishing (CMP) process until it trims the isolation structure 140a. Thereby, a top surface S3 of the isolation structure 140a trims with a top surface S4 of a buffer epitaxial layer 152b, as shown in FIG. 9. Thereafter, the buffer epitaxial layers 152b are etched back to a predetermined depth d1 to form buffer epitaxial layers 152 and recesses R1 between the liners 120, as shown in FIG. 10. As shown in FIG. 11, epitaxial layers 154a are formed on the buffer epitaxial layers 152 and fill the recesses R1. Then, the epitaxial layers 154a are planarized by methods such as a chemical mechanical polishing (CMP) process until they trim the isolation structure 140a, wherein the top surface S3 of the isolation structure 140a trims a top surface S5 of the epitaxial layer 154, as shown in FIG. 12.

In this embodiment, the buffer epitaxial layer 152 is formed between the epitaxial layer 154 and the bottom layers 112c. Hence, the lattice constants of the buffer epitaxial layer 152 and the epitaxial layer 154 should be different. Preferably, the lattice constants of the bottom layer 112c, the buffer epitaxial layer 152 and the epitaxial layer 154 should have gradient distribution. In another embodiment, the buffer epitaxial layer 152 may not be formed for saving processing cost or achieving other processing purposes. The epitaxial layers 154 and the buffer epitaxial layers 152 may preferably include trivalent elements, pentavalent elements or trivalent-pentavalent compounds. The epitaxial layers 154 serve as gate channels to improve performances such as electrical mobility of a formed transistor on the fin structures 112, depending upon practical requirements. As the epitaxial layer 154 is composed of indium gallium arsenide (InGaAs), the buffer epitaxial layer 152 may be composed of indium phosphide (InP); as the epitaxial layer 154 is composed of gallium arsenide (GaAs), the buffer epitaxial layer 152 may be composed of indium gallium phosphide (InGaP); as the epitaxial layer 154 is composed of gallium arsenide (GaAs), the buffer epitaxial layer 152 may be composed of aluminum gallium arsenide (AlGaAs); and as the epitaxial layer 154 is composed of germanium (Ge), the buffer epitaxial layer 152 may be composed of silicon germanium (SiGe).

Figure 13:
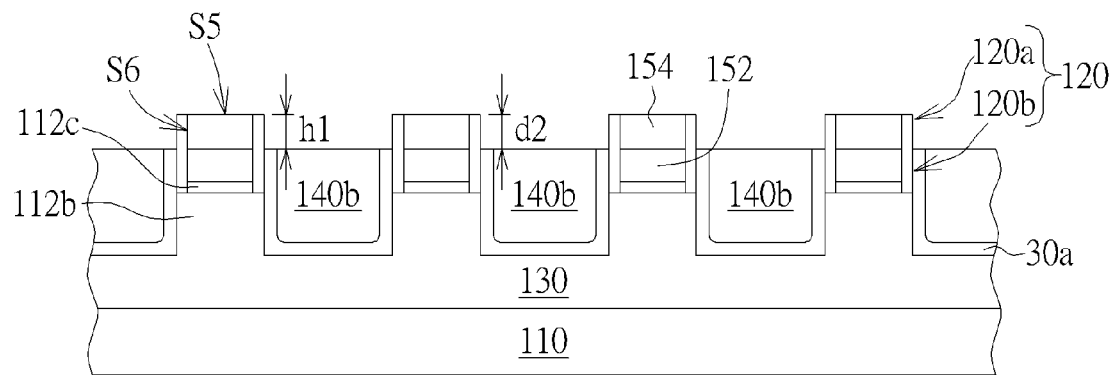

The isolation structure 140a is etched back to remove top parts of the isolation structures 140a until a predetermined depth d2 is exposed, to form an isolation structure 140b, as shown in FIG. 13. This means the epitaxial layers 154 protrude from the isolation structure 140b with a height h1 equal to the predetermined depth d2, and the height h1 of the epitaxial layers 154 is used to form gate structures disposed thereon, wherein a top surface S5 and two sidewalls S6 of each of the epitaxial layers 154 are used as gate channels. In this embodiment, the whole sidewalls of the epitaxial layers 154 protrude from the isolation structure 140b, but this is not limited thereto. In another embodiment, only partial sidewalls of the epitaxial layers 154 protrude from the isolation structure 140b.

Figure 14:
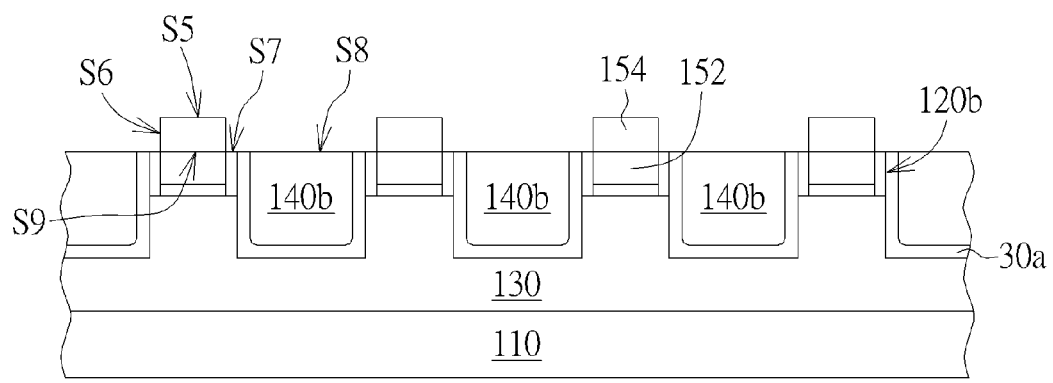

Thereafter, top parts 120a of the liners 120 are removed until the sidewalls S6 of the epitaxial layers 154 are exposed, so that liners 120b are reserved, as shown in FIG. 14. In this embodiment, the top parts 120a of the liners 120 are removed by serving the isolation structure 140b as a hard mask. Top surfaces S7 of the liners 120b trim a top surface S8 of the isolation structure 140b; the top surfaces S7 of the liners 120b trim bottom surfaces S9 of the epitaxial layers 154; the top surface S8 of the isolation structure trim the bottom surfaces S9 of the epitaxial layers 154; and the liners 120b are only disposed on sidewalls of the bottom layer 112c and the buffer epitaxial layers 152.

In this embodiment, the bottom layers 112c, the buffer epitaxial layers 152 and the epitaxial layers 154 are first located on the whole fin-shaped structures 112, and thus a gate (not shown) is later formed across the epitaxial layers 154 and a source/drain (not shown) is later formed in each of the epitaxial layers 154.

To summarize, the present invention provides a fin-shaped structure and a method thereof, which forms a liner on sidewalls of a top part of each fin-shaped structures, and then oxidizes a bottom part of each fin-shaped structure exposed by the liner and a part of a substrate between each of the fin-shaped structures, so that the bottom part of each fin-shaped structure and the part of the substrate can transform to form an oxide layer. The remaining fin-shaped structures (the top parts of the fin-shaped structures) can be electrically isolated from the substrate below and from each other. The bottom part of each fin-shaped structure may be oxidized by an oxidation process such as an $O_2$ steam annealing process, but this is not limited thereto. Furthermore, an oxide liner may be formed beside the bottom part of each fin-shaped structure before the oxide layer is formed to prevent the fin-shaped structures from collapsing while the oxide layer is formed.

The top parts of the fin-shaped structures covered by the liners are partially replaced with other materials, so that heterojunction fin-shaped structures can be formed. Performances such as electrical mobility of a formed semiconductor component disposed across these heterojunction fin-shaped structures can be improved. In a preferred embodiment, each heterojunction fin-shaped structure may be a stacked structure including a silicon layer, a buffer epitaxial layer and an epitaxial layer from bottom to top. The buffer epitaxial layer between the silicon layer and the epitaxial layer can buffer them by having a gradient lattice constant distribution from the silicon layer, and the buffer epitaxial layer to the epitaxial layer. Preferably, the epitaxial layer and the buffer epitaxial layer include trivalent elements, pentavalent elements or trivalent-pentavalent compounds.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a fin-shaped structure, comprising:
   providing a substrate having at least a fin structure thereon;
   forming a liner on sidewalls of the fin structure;
   forming an oxide layer between the fin structure and the substrate;
   forming an isolation structure beside the fin structure and on the oxide layer;
   removing the fin structure until a bottom layer of the fin structure remains, to form a recess between the liner;

sequentially forming a buffer epitaxial layer and an epitaxial layer in the recess;

removing a top part of the isolation structure to form a recessed isolation structure until the epitaxial layer protrudes from the recessed isolation structure; and after removing the top part of the isolation structure, removing a top part of the liner until sidewalls of the epitaxial layer are exposed.

2. The method of forming a fin-shaped structure according to claim 1, wherein the epitaxial layer and the buffer epitaxial layer comprise trivalent elements, pentavalent elements or trivalent-pentavalent compounds.

3. The method of forming a fin-shaped structure according to claim 1, wherein the liner is formed on the sidewalls of a top part of the fin structure.

4. The method of forming a fin-shaped structure according to claim 3, wherein the oxide layer is formed by oxidizing a part of the substrate and a bottom part of the fin structure exposed by the liner.

5. The method of forming a fin-shaped structure according to claim 4, wherein the oxide layer is formed by performing an O2 steam annealing process.

6. The method of forming a fin-shaped structure according to claim 4, further comprising:

forming an oxide liner beside the bottom part of the fin structure before the oxide layer is formed.

7. The method of forming a fin-shaped structure according to claim 1, wherein the bottom layer of the fin structure is a silicon layer.

8. The method of forming a fin-shaped structure according to claim 1, wherein the isolation structure is formed after the oxide layer is formed.

9. The method of forming a fin-shaped structure according to claim 1, wherein a top surface of a remaining portion of the liner is used to trim the isolation structure when the top part of the liner is removed.

* * * * *